(12) United States Patent
Chao

(10) Patent No.: US 6,277,713 B1
(45) Date of Patent: Aug. 21, 2001

(54) AMORPHOUS AND POLYCRYSTALLINE GROWING METHOD FOR GALLIUM NITRIDE BASED COMPOUND SEMICONDUCTOR

(76) Inventor: Juses Chao, 2Fl., No. 3, Alley 39, Lane 64, Sec. 1, Peithsin Rd., Hsintien City, Taipei Hsien (TW)

( * ) Notice: Subject to any disclaimer, the term of this patent is extended or adjusted under 35 U.S.C. 154(b) by 0 days.

(21) Appl. No.: 09/576,354

(22) Filed: May 22, 2000

(51) Int. Cl.$^7$ ................................................. H01L 21/36
(52) U.S. Cl. .............................. 438/483; 438/46; 438/285
(58) Field of Search .................................... 438/285, 483, 438/46, 47

(56) References Cited

U.S. PATENT DOCUMENTS

| | | | |
|---|---|---|---|
| 5,563,422 | * 10/1996 | Nakamura et al. | 257/13 |
| 5,637,531 | * 6/1997 | Porowski et al. | 117/89 |
| 6,060,335 | * 5/2000 | Rennie et al. | 438/46 |

FOREIGN PATENT DOCUMENTS

| | | |
|---|---|---|
| 607435-A1 | * 7/1994 | (EP) . |
| 817283-A1 | * 11/1998 | (EP) . |
| 890997-A2 | * 1/1999 | (EP) . |

* cited by examiner

*Primary Examiner*—Trung Dang
(74) *Attorney, Agent, or Firm*—Rosenberg, Klein & Lee

(57) ABSTRACT

The amorphous and polycrystalline structures of a GaN-based semiconductor are grown on the surface of a compound semiconductor layer showing by formation of $In_xAl_yGa_{(1-x-y)}N (0 \leq (x,y) \leq 1.0000,$ and $(x+y) \leq 1.0000)$. More specified from others, different kinds of the amorphous and polycrystalline structures of the InAlGaN based compound semiconductor layers grown on the surface of the InAlGaN based compound semiconductor can be functionally well significantly, and can be applied together or individually in different band-gap designs for different compound semiconductors.

11 Claims, 2 Drawing Sheets

AMORPHOUS AND POLYCRYSTALLINE GROWING METHOD FOR GALLIUM NITRIDE BASED COMPOUND SEMICONDUCTOR

FIELD OF THE INVENTION

The present invention relates to an amorphous and/or polycrystalline growing method, especially to an amorphous or polycrystalline growing method for gallium nitride based compound semiconductor.

BACKGROUND OF THE INVENTION

The compound semiconductor devices had been found useful application for display and communication products etc. More particularly, the GaN based compound semiconductors have received much attention because of the blue light emitting ability and its high efficient photon emitting function. The GaN based compound semiconductor is direct band-gap materials with high efficient energy-transferring rate and has wide band-gap distribution.

U.S. Pat. No. 5,563,422 has proposed a manufacturing method of GaN based compound semiconductors, wherein crystalline GaN based compound semiconductors are specifically used to manufacture light emitting diodes. However, the crystalline GaN based compound semiconductors have the problems of high cost and low yield.

Therefore, it is the object of the present invention to provide a manufacturing method of GaN based compound semiconductors with lower cost and higher yield.

To achieve the above object, the manufacturing method of GaN based compound semiconductors according to the present invention comprises the following steps:

(a) vapor-growing a first amorphous and/or polycrystalline compound semiconductor layer over a substrate by the formation $In_xAl_yGa_{(1-x-y)}N$ ($0 \leq (x,y) \leq 1.0000$, and $(x+y) \leq 1.0000$), at a thickness of 0.0001–10.00 um, and at a first growing temperature between 180–1100° C.;

(b) vapor-growing a first additional amorphous and/or polycrystalline compound semiconductor layer over said first compound semiconductor layer by the same formation, but with or without same parameter, at a thickness of 0.0001–10.00 um, and at a second growing temperature between 800–1200° C.;

Moreover, the manufacturing method of GaN based compound semiconductors according to the present invention can further comprises the following steps:

(c) vapor-growing a second amorphous and/or polycrystalline compound semiconductor layer over said first additional compound semiconductor layer by the same formation, but at a third growing temperature lower than said second growing temperature;

(d) vapor-growing a second additional amorphous and/or polycrystalline compound semiconductor layer over said second compound semiconductor layer by the same formation, but at a fourth growing temperature higher than said third growing temperature.

The various objects and advantages of the present invention will be more readily understood from the following detailed description when read in conjunction with the appended drawing, in which:

DETAIL DESCRIPTION OF PREFERRED EMBODIMENT

Figure 1:
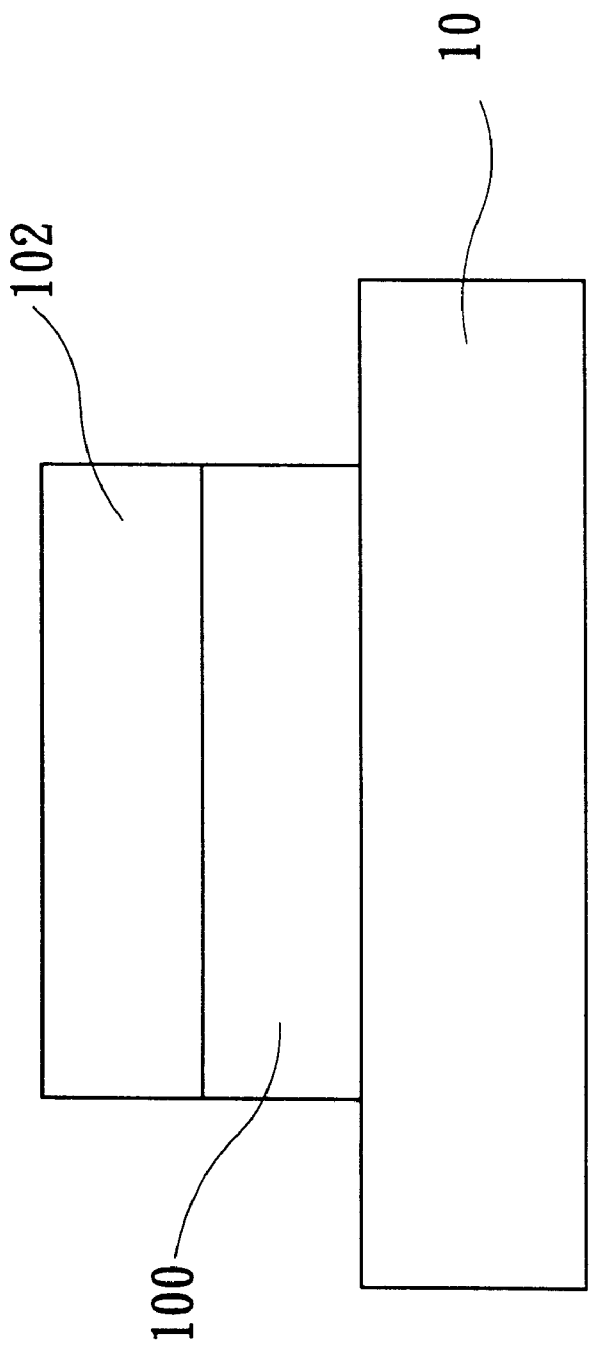
FIG. 1 is a sectional view of the compound semiconductor device manufactured according to the first preferred embodiment of the present invention.

The present invention is intended to provide an amorphous and polycrystalline growing method for gallium nitride based compound semiconductor. The compound semiconductor device manufactured according to the first preferred embodiment of the present invention is shown in FIG. 1.

Firstly, the method vapor-grows a first amorphous and/or polycrystalline compound semiconductor layer 100 over a substrate 10, by the formation $In_xAl_yGa_{(1-x-y)}N$ ($0.0000 \leq (x,y) \leq 1.0000$, and $(x+y) \leq 1.0000$), at a thickness of 0.0001–10.00 um, and at a first growing temperature between 180–1100° C. The substrate 10 can be one of the sapphire, GaN, Si, SiC or GaAs.

Afterward, the methods vapor-grows a first additional amorphous and/or polycrystalline compound semiconductor layer 102 over the first compound semiconductor layer 100 by the same formation, but with or without same parameter, at a thickness of 0.0001–10.00 um, and at a second growing temperature between 800–1200° C.

The first compound semiconductor layer 100 and the first additional compound semiconductor layer 102 can be doped with p- and/or n-type impurities with concentration $10^{14-22}$ EA/cm$^3$ to provide rectifier, LED or light detector devices. Moreover, the first compound semiconductor layer 100 and the first additional compound semiconductor layer 102 can be doped with i-type impurities with concentration $10^{14-22}$ EA/cm$^3$ to provide resistivity-function element in high or low.

The p-type impurity is selected form the group consisting of Zinc, Magnesium, Beryllium, Strontium, Barium and Cadmium. The n-type impurity is selected form the group consisting of Silicon, Germanium, Tin, Sulfur, Tellurium and Selenium. Moreover, heating, annealing, electron-beam shooting for temperature between 601° C. to 1200° C., and operation time between 1 to 50 minutes can be performed after above process.

The reaction gas contains ammonia or hydrazine, or ammonia-hydrazine combined trimethylaluminum and the reaction gas can further contain the single or combined gas from the trimethyl gallium and/or triethyl gallium. Moreover, the reaction gas further contains at least one gas of diethyl-zinc, trimethyl-zinc, trimethyl-indium, and cyclopentadienyl-magnesium.

Figure 2:
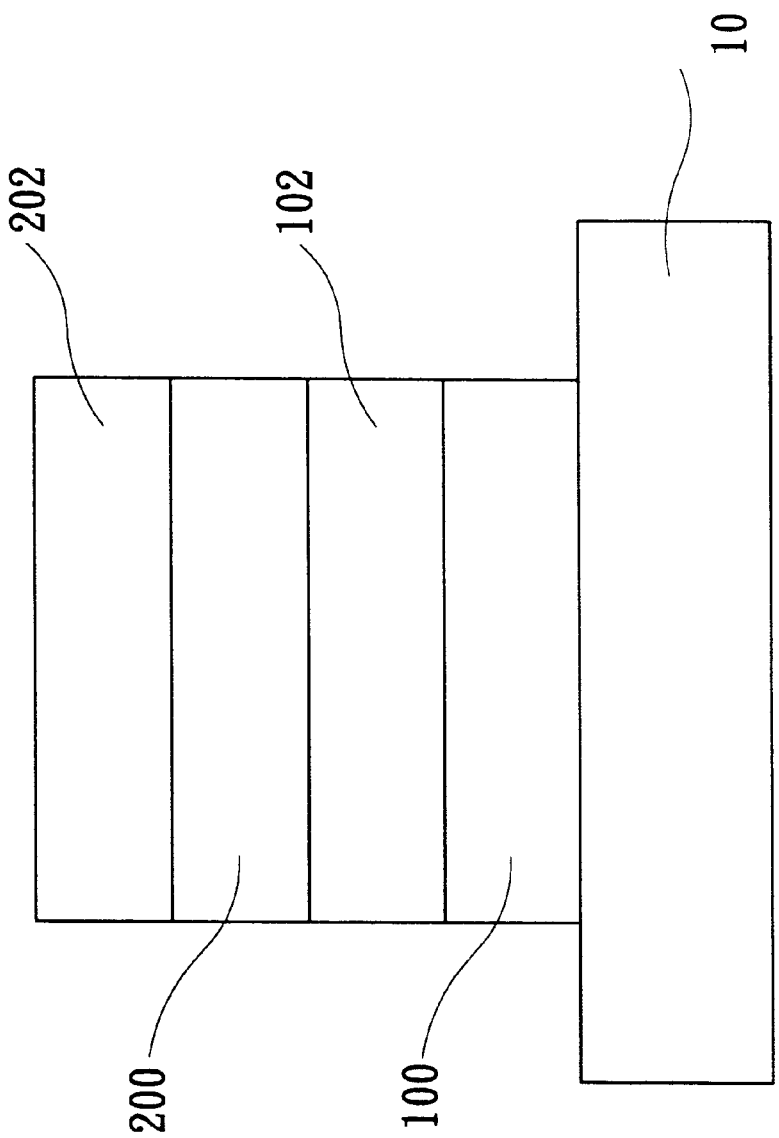
FIG. 2 is a sectional view of the compound semiconductor device manufactured according to the second preferred embodiment of the present invention.

FIG. 2 is a sectional view of the compound semiconductor device manufactured according to the second preferred embodiment of the present invention.

Firstly, the method vapor-grows a first amorphous and/or polycrystalline compound semiconductor layer 100 over a substrate 10 by the formation $In_xAl_yGa_{(1-x-y)}N$ ($0.0000 \leq (x,y) \leq 1.0000$, and $(x+y) \leq 1.0000$), at a thickness of 0.0001–10.00 um, and at a first growing temperature between 180–1100° C. The substrate 10 sapphire, GaN, Si, SiC or GaAs.

Afterward, the methods vapor-grows a first additional amorphous and/or polycrystalline compound semiconductor layer 102 over the first compound semiconductor layer 100 by the same formation, but with or without same parameter, at a thickness of 0.0001–10.00 um, and at a second growing temperature between 800–1200° C.

Afterward, the method vapor-grows a second amorphous and/or polycrystalline compound semiconductor layer 200 over the first additional compound semiconductor layer 102 by the same formation, but at a third growing temperature lower than said second growing temperature.

Afterward, the method vapor-grows a second additional amorphous and/or polycrystalline compound semiconductor layer 202 over the second compound semiconductor layer 200 by the same formation, but at a fourth growing temperature higher than said third growing temperature.

The first compound semiconductor layer 100 and the first additional compound semiconductor layer 102; the second compound semiconductor layer 200 and the second additional compound semiconductor layer 202 can be doped with i-, p- and/or n-type impurities with concentration $10^{14-22}$ EA/cm$^3$ to provide pin, P/N structure device or other devices.

The p-type impurity is selected form the group consisting of Zinc, Magnesium, Beryllium, Strontium, Barium and Cadmium. The n-type impurity is selected form the group consisting of Silicon, Germanium, Tin, Sulfur, Tellurium and Selenium. Moreover, heating, annealing, electron-beam shooting for temperature between 601° C. to 1200° C., and operation time between 1 to 50 minutes can be performed after above process.

The reaction gas contains ammonia or hydrazine, or ammonia-hydrazine combined trimethylaluminum and the reaction gas can further contain the single or combined gas from the trimethyl gallium and/or triethyl gallium. Moreover, the reaction gas further contains at least one gas of diethyl-zinc, trimethyl-zinc, trimethyl-indium, and cyclopentadienyl-magnesium.

The compound semiconductor layer can be applied together or individually in homostructure, heterostructure, or double heterostructure, e.g., the quantum well/multi-quantum well or super-lattice, of different band-gap designs for different compound semiconductors.

Moreover, the semiconductor developing steps of vapor growing, spotting, epoxy attaching, deposition, electric platting and MBE can be incorporated into above processes.

The following table explains the possible compositions of two-layer system shown in FIG. 1.

| No | 1st layer | 2nd layer | junction type | possible devices |
|---|---|---|---|---|
| 1 | N | N | homo/hetero | diode |
| 2 | N | N | hetero | diode |
| 3 | N | I | hetero | diode |
| 4 | P | N | hetero | diode |
| 5 | P | P | homo/hetero | diode |
| 6 | P | I | hetero | diode |
| 7 | I | N | hetero | diode |
| 8 | I | P | hetero | diode |
| 9 | I | I | homo/hetero | resistor |

*homo: homojunction; hetero: heterojunction

Moreover, the above table can be generalized to more complex compound semiconductor layer system. For examples, the double heterojunction can be formed by system with more layers.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. An amorphous and/or polycrystalline growing method for based compound semiconductor, comprising the following steps:

(a) vapor-growing a first amorphous and/or polycrystalline compound semiconductor layer over a substrate by the formation $In_xAl_yGa_{(1-x-y)}N$ (0.0000≦(x,y) ≦1.0000, and (x+y)≦1.0000), at a thickness of 0.0001–10.00 um, and at a first growing temperature between 180–1100° C.;

(b) vapor-growing a first additional amorphous and/or polycrystalline compound semiconductor layer over said first compound semiconductor layer by the same formation, but with or without same parameter, at a thickness of 0.0001–10.00 um, and at a second growing temperature between 800–1200° C.

2. The amorphous and/or polycrystalline growing method as in claim 1, further comprising the following steps:

(c) vapor-growing a second amorphous and/or polycrystalline compound semiconductor layer over said first additional compound semiconductor layer by the same formation, but at a third growing temperature lower than said second growing temperature;

(d) vapor-growing a second additional amorphous and/or polycrystalline compound semiconductor layer over said second compound semiconductor layer by the same formation, but at a fourth growing temperature higher than said third growing temperature.

3. The amorphous and/or polycrystalline growing method as in claim 1 or 2, further comprising a step of adding an i- and/or p- and/or n-type impurity into said compound semiconductor layer at a concentration between $10^{14-22}$ EA/cm$^3$.

4. The amorphous and/or polycrystalline growing method as in claim 3, wherein the p-type impurity is selected form the group consisting of Zinc, Magnesium, Beryllium, Strontium, Barium and Cadmium.

5. The amorphous and/or polycrystalline growing method as in claim 3, wherein the n-type impurity is selected form the group consisting of Silicon, Germanium, Tin, Sulfur, Tellurium and Selenium.

6. The amorphous and/or polycrystalline growing method as in claim 3, further comprising step of heating, annealing, electron-beam shooting for temperature between 601° C. to 1200° C., and operation time between 1 to 50 minutes.

7. The amorphous and/or polycrystalline growing method as in claim 1 or 2, wherein an ammonia or hydrazine, or ammonia-hydrazine combined trimethylaluminum reaction gas s used to develop said compound semiconductor layer and the reaction gas contains the single or combined gas from the trimethyl gallium and/or triethyl gallium.

8. The amorphous and/or polycrystalline growing method as in claim 7, said reaction gas further contains at least one gas of diethyl-zinc, trimethyl-zinc, trimethyl-indium, and cyclopentadienyl-magnesium.

9. The amorphous and/or polycrystalline growing method as in claim 1 wherein the substrate can be sapphire, GaN, Si, SiC or GaAs.

10. The amorphous and/or polycrystalline growing method as in claim 1 or 2 wherein said compound semiconductor layer can be applied together or individually in homostructure, heterostructure, or double heterostructure, e.g., the quantum well/multi-quantum well or super-lattice, of different band-gap designs for different compound semiconductors.

11. The amorphous and/or polycrystalline growing method as in claim 1 or 2, further comprising semiconductor developing steps of vapor growing, spotting, epoxy attaching, deposition, electric platting and MBE.

* * * * *